(12) United States Patent
Sank

(10) Patent No.: US 12,198,001 B2
(45) Date of Patent: Jan. 14, 2025

(54) BALANCED INDUCTIVE AND CAPACITIVE RESONATOR COUPLING FOR QUANTUM COMPUTING SYSTEM

(71) Applicant: Google LLC, Mountain View, CA (US)

(72) Inventor: Daniel Sank, Goleta, CA (US)

(73) Assignee: GOOGLE LLC, Mountain View, CA (US)

( * ) Notice: Subject to any disclaimer, the term of this patent is extended or adjusted under 35 U.S.C. 154(b) by 1170 days.

(21) Appl. No.: 17/010,267

(22) Filed: Sep. 2, 2020

(65) Prior Publication Data

US 2021/0065036 A1 Mar. 4, 2021

Related U.S. Application Data

(60) Provisional application No. 62/895,145, filed on Sep. 3, 2019.

(51) Int. Cl.
*G06N 10/00* (2022.01)
*G06N 10/40* (2022.01)
*H10N 60/10* (2023.01)

(52) U.S. Cl.
CPC ............. *G06N 10/00* (2019.01); *G06N 10/40* (2022.01); *H10N 60/10* (2023.02)

(58) Field of Classification Search
CPC ......... G06N 10/00; G06N 10/40; H10N 60/10
See application file for complete search history.

(56) References Cited

U.S. PATENT DOCUMENTS

2016/0125309 A1  5/2016  Naaman et al.
2016/0156356 A1* 6/2016  Bronn ..................... G06N 10/00
                                                 326/1
2019/0165240 A1* 5/2019  Brink ...................... H01P 5/028

FOREIGN PATENT DOCUMENTS

WO    WO2004/102470    11/2004

OTHER PUBLICATIONS

Koch, Jens, et al. "Charge-insensitive qubit design derived from the Cooper pair box." Physical Review A 76.4 (2007): 042319. (Year: 2007).*
Devoret, Michel H., Andreas Wallraff, and John M. Martinis. "Superconducting qubits: A short review." arXiv preprint cond-mat/0411174 (2004). (Year: 2004).*
(Continued)

*Primary Examiner* — Markus A. Vasquez
(74) *Attorney, Agent, or Firm* — DORITY & MANNING P.A.

(57) ABSTRACT

Systems and methods for balanced inductive and capacitive coupling for quantum circuits are provided. A quantum circuit can include a qubit structure comprising an inductor and at least a first portion of a qubit capacitor. The quantum circuit can further include a ground, and a second portion of the qubit capacitor coupled to the ground. The quantum circuit can further include a readout resonator configured to measure a state of the qubit structure. The quantum circuit can further include a capacitive coupling between the readout resonator and the qubit structure and an inductive coupling between the readout resonator and the inductor of the qubit structure. A coupling strength of the inductive coupling and a coupling strength of the capacitive coupling can be approximately equal in magnitude.

19 Claims, 10 Drawing Sheets

(56) References Cited

OTHER PUBLICATIONS

Sank et al., "Measurement-Induced State Transitions in a Superconducting Qubit: Beyond the Rotating Wave Approximation", Physical Review Letters, vol. 117, No. 19, Nov. 1, 2016.
Yamamoto et al., "Superconducting Flux Qubit Capacitively Coupled to an LC Resonator", New Journal of Physics, Institute of Publishing, Bristol, Great Britain, vol. 16, No. 1, Jan. 10, 2014.
Heinsoo, "Rapid high-fidelity multiplexed readout of superconducting qubits", arXiv:1801.07904v1, Jan. 24, 2018, 13 pages.
Jeffrey, "Fast Accurate State Measurement with Superconducting Qubits", Physical Review Letters, vol. 112, Issue 19, May 16, 2014, 5 pages.
Walter, "Realizing Rapid, High-Fidelity, Single-Shot Dispersive Readout of Superconducting Qubits", arXiv:1701.06933v2, Jan. 25, 2017, 10 pages.

\* cited by examiner

BALANCED INDUCTIVE AND CAPACITIVE RESONATOR COUPLING FOR QUANTUM COMPUTING SYSTEM

PRIORITY CLAIM

The present application is based on and claims benefit of U.S. Provisional Application 62/895,145 having a filing date of Sep. 3, 2019, which is incorporated by reference herein.

FIELD

The present disclosure relates generally to quantum computing systems. More particularly, the present disclosure relates to systems and methods that implement a balanced inductive and capacitive coupling between a qubit and a resonator to reduce or eliminate non-rotating wave approximation processes.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b|1\rangle$. The "0" and "1" states of a digital computer are analogous to the $|0\rangle$ and $|1\rangle$ basis states, respectively of a qubit.

One approach to measuring the state of a qubit is dispersive measurement, in which a readout resonator is coupled to the qubit. The state of the qubit can be measured by applying a measurement pulse to the readout resonator. However, as the power of the measurement pulse is increased, such as to achieve increased measurement accuracy, the measurement pulse can cause unwanted state changes of the qubit.

SUMMARY

Aspects and advantages of embodiments of the present disclosure will be set forth in part in the following description, or can be learned from the description, or can be learned through practice of the embodiments.

One example aspect of the present disclosure is directed to a quantum circuit. The quantum circuit can include a qubit structure comprising an inductor and at least a first portion of a qubit capacitor. The quantum circuit can further include a ground, and a second portion of the qubit capacitor coupled to the ground. The quantum circuit can further include a readout resonator configured to measure a state of the qubit structure. The quantum circuit can further include a capacitive coupling between the readout resonator and the qubit structure and an inductive coupling between the readout resonator and the inductor of the qubit structure. A coupling strength of the inductive coupling and a coupling strength of the capacitive coupling can be approximately equal in magnitude.

Another example aspect of the present disclosure is directed to a quantum computing system. The quantum computing system can include one or more quantum circuits. At least a first quantum circuit of the one or more quantum circuits can include a readout resonator and a qubit structure. The qubit structure can be both capacitively coupled to the readout resonator and inductively coupled to the readout resonator. A capacitive coupling strength between the qubit structure and the readout resonator can approximately equal an inductive coupling strength between the qubit structure and the readout resonator.

Another example aspect of the present disclosure is directed to a method of measuring a state of a qubit structure. The qubit structure can include at least a first portion of a qubit capacitor and an inductor. A second portion of the qubit capacitor can be coupled to a ground. The method can include capacitively coupling a readout resonator to the qubit structure. The method can further include selecting an inductive coupling to balance the capacitive coupling to reduce or remove one or more non-rotating wave approximation processes. The method can further include coupling the readout resonator to the qubit structure according to the selected inductive coupling. The method can further include applying a measurement pulse to the readout resonator. In response to the measurement pulse, the method can further include obtaining a measurement of the state of the qubit structure.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

Figure 1:
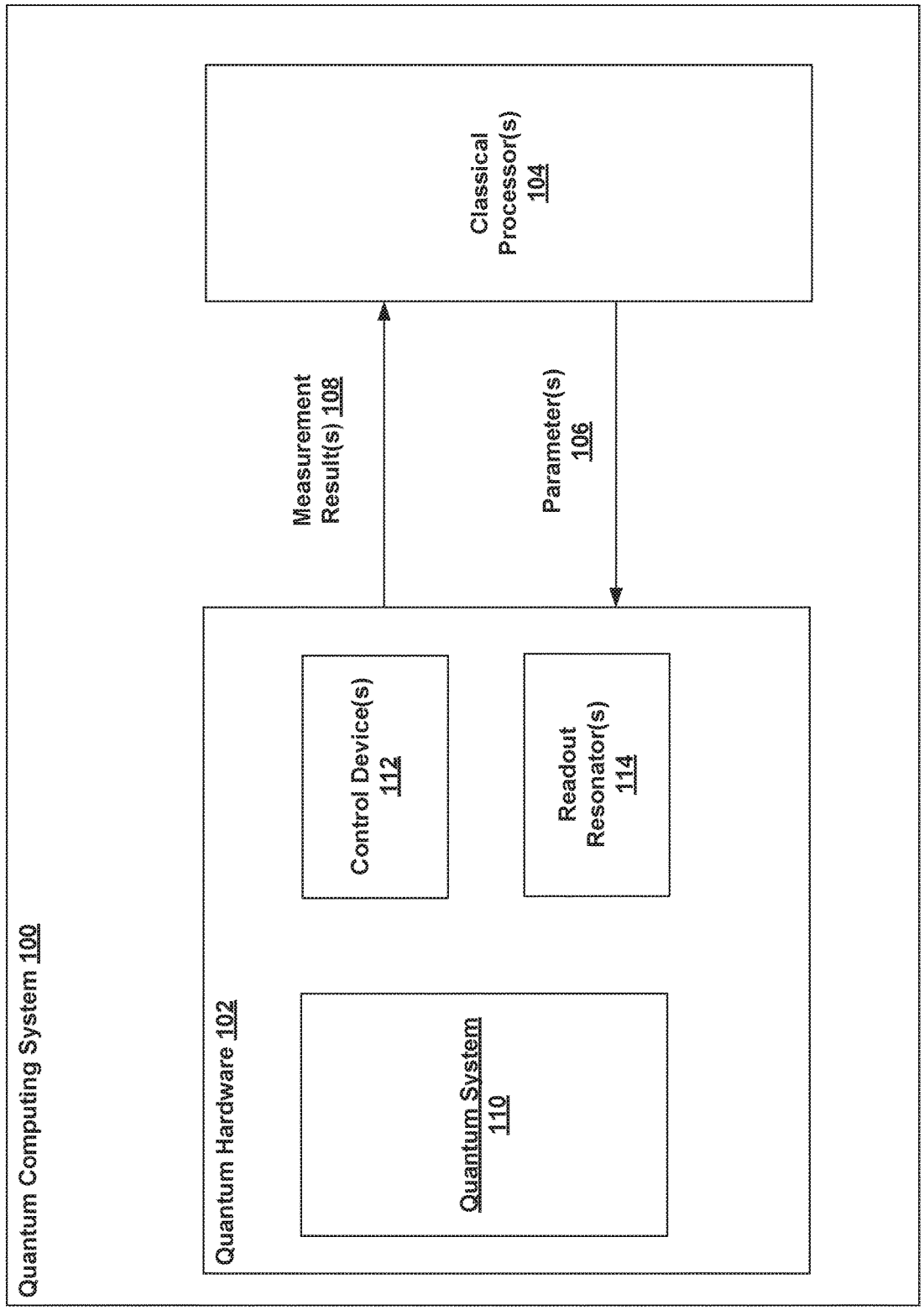
FIG. 1 depicts an example quantum computing system according to example aspects of the present disclosure.

Reference numerals that are repeated across plural figures are intended to identify the same features in various implementations.

DETAILED DESCRIPTION

Generally, the present disclosure is directed to systems, devices, and methods which can allow for increased measurement power to be used in quantum computing systems. For example, a quantum computing system can include one or more superconducting qubit structures. The qubit can be capacitively coupled to a readout resonator, which can be configured to measure a state of the qubit by, for example, using a microwave pulse. According to example aspects of the present disclosure, the qubit can also be inductively coupled to the readout resonator. The strength of the inductive coupling and the strength of the capacitive coupling can be balanced (e.g., approximately equal but with an opposite sign), which in turn can reduce and/or eliminate non-rotating wave approximation (RWA) processes during state measurement. By reducing and/or removing the non-RWA processes, higher power measurements can be used, which can improve quantum computing system performance.

More particularly, the systems and methods of the present disclosure can reduce and/or eliminate non-RWA processes which can cause unwanted state change during qubit measurement. For example, in quantum computing systems, dispersive measurement can be used to measure superconducting qubits by coupling the qubit, an anharmonic resonator, to an auxiliary harmonic resonator. The qubit can be, for example, a transmon qubit, a charge qubit, a flux qubit, or other superconducting qubit. However, when the qubit and the resonator are coupled, certain physical processes can be introduced during state measurement, which can adversely impact the measurement process. One approach to analyzing dispersive measurement in a superconducting qubit is the "rotating wave approximation" (RWA), in which non-RWA processes are ignored. However, if state measurement is performed at too high of a pulse power, these non-RWA processes can cause the qubit state to undesirably change randomly during the dispersive measurement process.

The systems and methods of the present disclosure can reduce and/or eliminate these non-RWA processes by implementing a coupling inductance to balance the coupling capacitance between the qubit and the resonator. For example, a quantum circuit of a quantum computing system can include a qubit structure comprising a qubit inductor and at least a first portion of a qubit capacitor. A second portion of the qubit capacitor can be coupled to a ground. A readout resonator configured to measure a state of the qubit structure can be capacitively coupled to the qubit structure. For example, the capacitive coupling can be implemented via a gap between the qubit and a capacitive end of the readout resonator. In some implementations, the readout resonator can be a dispersive readout resonator, which can include the use of a Purcell filter.

According to example aspects of the present disclosure, an inductive coupling can also be included between the readout resonator and the inductor of the qubit structure. For example, in some implementations, the inductor of the qubit structure can include one or more Josephson junctions. In some implementations, the inductor can include two Josephson junctions arranged in a superconducting quantum interference device (SQUID). A first end of the SQUID can be electrically coupled to the qubit capacitor of the qubit, and a second end of the SQUID can be electrically coupled to the ground.

In some implementations, the inductive coupling can be implemented by including an inductor coupled between the SQUID (or other inductor of the qubit) and an inductive end of the readout resonator. For example, in some implementations, the inductive coupling can include a conductor electrically connected between the inductive end of the readout resonator and a node between the SQUID and the ground. In some implementations, an inductor can be coupled between the node and the ground.

In some implementations, the inductive coupling can include a first inductor coupled between the inductive end of the readout resonator and a node connected to the ground, and a second inductor coupled between the node and the SQUID. For example, the second inductor can be coupled between the qubit capacitor and the ground.

The inductive coupling can be selected to balance the capacitive coupling to reduce and/or eliminate the non-RWA processes. For example, the anharmonic resonator of the qubit and the readout resonator can each have a characteristic impedance, denoted by $Z_a'$ and $Z_b'$, respectively. The strength of the capacitive coupling $C_g'$ can be determined based at least in part on a gap distance between the qubit and the readout resonator. According to example aspects of the present disclosure, the strength of the inductive coupling $C_g'$ can be selected to approximately satisfy the condition in which $L_g'/C_g' = Z_a' Z_b'$. Stated differently, the impedance of the coupling elements can be approximately equal but with an opposite sign to the geometric mean of the impedances of the qubit and readout resonator. This equal impedance condition is equivalent to the condition that the strength of the inductive and capacitive coupling are equal, but of opposite sign. For example, by selecting a coupling strength of the inductive coupling to be approximately equal to the coupling strength of the capacitive coupling, one or more non-rotating wave approximation processes can be reduced and/or eliminated as compared to a quantum circuit without the inductive coupling between the readout resonator and the inductor of the qubit. Further, the coupling strength of the inductive coupling and the coupling strength of the capacitive coupling can be approximately equal such that a measurement pulse does not induce a significant change in the qubit structure state. For example, an incidence rate of a state change induced by a measurement pulse of less than 0.5% can be considered insignificant.

The systems and methods of the present disclosure can provide a number of technical effects and benefits. For example, by including an inductive coupling to balance a capacitive coupling between a qubit and a readout resonator, non-RWA processes in dispersive measurement can be reduced and/or eliminated. Further, by reducing and/or eliminating the non-RWA processes, an incidence rate of random state change induced by the measurement process can be reduced.

Moreover, the systems and methods of the present disclosure can allow for increased measurement power to be used during the measurement process, thereby allowing for an increased signal-to-noise ratio during measurement. By increasing the signal-to-noise ratio, measurement accuracy can be improved, allowing for more accurate quantum computing systems.

Additionally, the systems and methods of the present disclosure can be implemented in a multi-qubit quantum computing system. For example, a plurality of qubits can each be inductively and capacitively coupled to their associated readout resonators in a multiplexed configuration. This can allow for more complex quantum computing systems capable of performing more complex computations.

With reference now to the figures, example aspects of the present disclosure will be discussed in further detail. FIG. 1 depicts an example quantum computing system 100. The example system 100 is an example of a system implemented as classical or quantum computer program on one or more classical computers or quantum computing devices in one or more locations, in which the systems, components, and techniques described below can be implemented.

The system 100 includes quantum hardware 102 in data communication with one or more classical processors 104. The quantum hardware 102 includes components for performing quantum computation. For example, the quantum hardware 102 includes a quantum system 110, control device(s) 112, and readout resonator(s) 114. The quantum system 110 can include one or more multi-level quantum subsystems, such as a register of qubits. In some implementations, the multi-level quantum subsystems can include superconducting qubits, such as flux qubits, charge qubits, transmon qubits, etc.

The type of multi-level quantum subsystems that the system 100 utilizes may vary. For example, in some cases it may be convenient to include one or more readout resonators 114 attached to one or more superconducting qubits, e.g., transmon, flux, Gmon, Xmon, or other qubits. In other cases ion traps, photonic devices or superconducting cavities (with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 110 via multiple control lines that are coupled to one or more control devices 112. Example control devices 112 that operate on the register of qubits include quantum logic gates or circuits of quantum logic gates, e.g., Hadamard gates, controlled-NOT (CNOT) gates, controlled-phase gates, or T gates. In some implementations T gates may be stored in one or more T factories included in the quantum hardware 102. The one or more control devices 112 may be configured to operate on the quantum system 110 through one or more respective control parameters (e.g., one or more physical control parameters). For example, in some implementations the multi-level quantum subsystems may be superconducting qubits and the control devices 112 may include one or more digital to analog converters (DACs) with respective voltage physical control parameters.

The quantum hardware 102 may further include measurement devices, e.g., readout resonators 114. Measurement results 108 obtained via measurement devices may be provided to the classical processors 104 for processing and analyzing. In some implementations, the quantum hardware 102 may include a quantum circuit and the control device(s) 112 and readout resonator(s) 114 may include one or more quantum logic gates that operate on the quantum system 102 through microwave pulse physical control parameters that are sent through wires included in the quantum hardware 102. Further examples of control devices include arbitrary waveform generators, wherein a DAC creates the signal. The control parameters may include qubit frequencies.

The readout resonator(s) 114 may be configured to perform quantum measurements on the quantum system 110 and send measurement results 108 to the classical processors 104. In addition, the quantum hardware 102 may be configured to receive data specifying physical control parameter values 106 from the classical processors 104. The quantum hardware 102 may use the received physical control parameter values 106 to update the action of the control device(s) 112 and readout resonator(s) 114 on the quantum system 110. For example, the quantum hardware 102 may receive data specifying new values representing voltage strengths of one or more DACs included in the control devices 112 and may update the action of the DACs on the quantum system 110 accordingly.

The classical processors 104 may be configured to initialize the quantum system 110 in an initial quantum state, e.g., by sending data to the quantum hardware 102 specifying an initial set of parameters 106.

Figure 2:
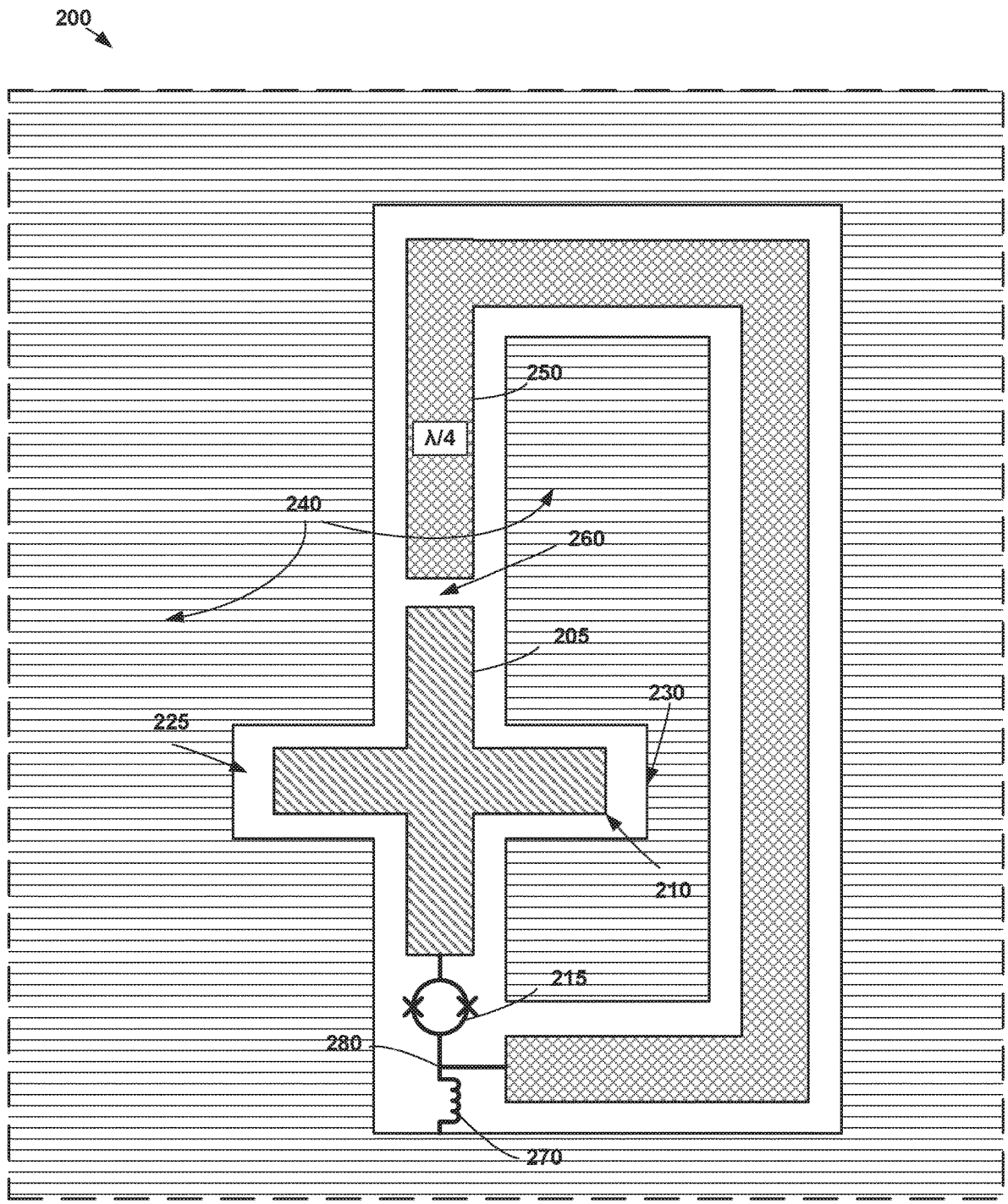
FIG. 2 depicts an example illustration of a quantum circuit configured in a single plane according to example aspects of the present disclosure.

Referring now to FIG. 2, an example illustration of a quantum circuit 200 according to example aspects of the present disclosure is depicted. As shown, the quantum circuit 200 can include a qubit structure, which can include a superconducting island 205 and an inductor. For example, as depicted, the inductor can be a SQUID 215, which can include two Josephson junctions. In other implementations, the qubit structure can include one or more Josephson junctions or other types of inductors. As shown, the superconducting island 205 is separated from a ground plane 240 by a gap 225. For example, as shown in FIG. 2, the ground plane 240 is depicted by horizontal lines, which comprise an electrically connected plane. The gap 225 between the island 205 and the ground plane 240 can be, for example, a non-conductive material. A first edge portion 210 of the island 205 and a second edge portion 230 of the ground plane 240 can together comprise a qubit capacitance.

The qubit structure is an anharmonic resonator, and can be coupled to a readout resonator 250, which is an auxiliary harmonic resonator. For example, as shown in FIG. 2, the qubit structure can also be capacitively coupled to the readout resonator 250. For example, the gap 260 between the superconducting island 205 and the readout resonator 250 can capacitively couple the qubit structure to the readout resonator 250. In some implementations, the readout resonator can be a quarter wave readout resonator configured to measure the state of the qubit structure using dispersive measurement.

The readout resonator 250 can take advantage of a difference in the qubit structure's impedance for the $|0\rangle$ and $|1\rangle$ states to measure the state of the qubit. For example, the resonance frequency of the readout resonator 250 takes on different values when the qubit is in the state $|0\rangle$ or the state $|1\rangle$, due to the nonlinearity of the qubit. Therefore, a microwave pulse reflected from the readout resonator 250 carries an amplitude and phase shift that depend on the qubit state. In some implementations, a Purcell filter can be used in conjunction with the readout resonator 250 to impede microwave propagation at the qubit frequency.

The dispersive measurement signal to noise ratio (SNR) is approximately given by the formula SNR=T*P/S, where T is the length of a pulse, P is the measurement power, and S is the noise spectral density. In order to achieve >99% accuracy in the dispersive measurement process, the SNR may need to be 11 or more. To increase the SNR, in principle, T can be increased, P can be increased, or S can be decreased. However, decreasing S is not practically possible because the spectral noise density is set by a fundamental limit in quantum mechanics, and increasing T is possible only if the qubit coherence time is increased proportionally. Thus, to improve the SNR, one approach is to increase the measurement power P. However, increasing the measurement power P can lead to unwanted random changes in the qubit state during the dispersive measurement process due to non-RWA processes. The non-RWA processes can be enabled due to the coupling of the anharmonic resonator qubit structure to the auxiliary harmonic readout resonator 250.

According to example aspects of the present disclosure, the quantum circuit 200 can also include a balanced inductive coupling between the readout resonator 250 and the qubit structure, which can reduce and/or eliminate the non-RWA processes.

For example, as shown in FIG. 2, an inductor 270 can be connected between the ground plane 240 and a node 280. The node 280 can be connected between the SQUID 215 and the inductor 270. The readout resonator 250 can be inductively coupled to the qubit structure by connecting to the node 280. In some implementations, the inductor 270 can be, for example, a thin wire (e.g., a thin superconducting wire), a coil of wire, a Josephson junction, or other suitable inductor.

According to additional aspects of the present disclosure, the strength of the inductive coupling and the strength of the capacitive coupling can be of approximately equal magnitude. By balancing the inductive and capacitive coupling strengths, the non-RWA processes can be reduced and/or eliminated.

Figure 3:
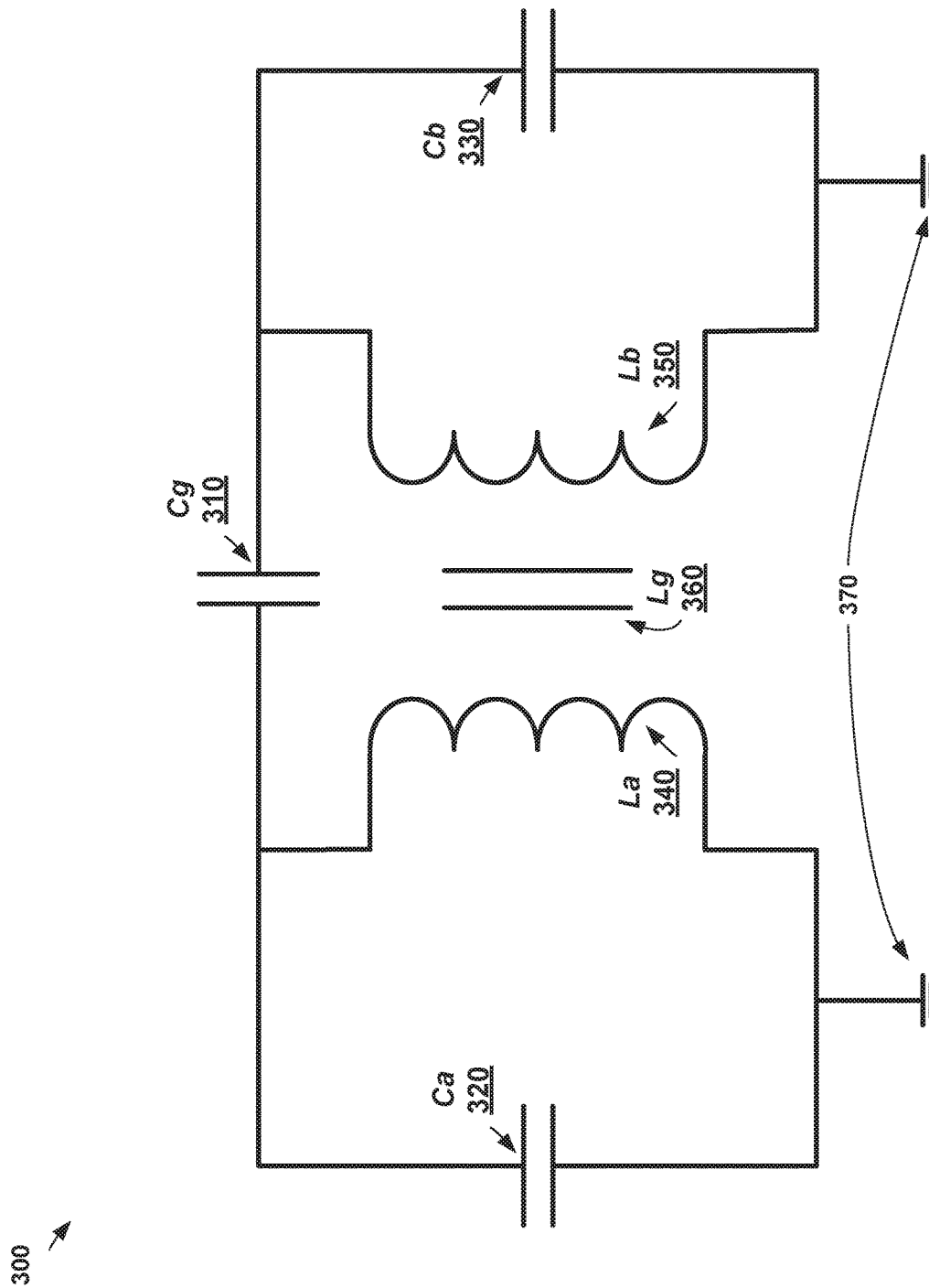
FIG. 3 depicts an example circuit diagram of two coupled oscillators according to example aspects of the present disclosure.

For example, consider two coupled LC oscillators 300 as shown in FIG. 3. A first oscillator "a" can include a capacitor $C_a$ 320 and an inductor $L_a$ 340 in parallel and coupled to a ground 370, and a second oscillator "b" can include a capacitor $C_b$ 330 and an inductor $L_b$ 330 in parallel and coupled to the ground 370. The first oscillator and second oscillator can be coupled by a capacitor $C_g$ 310 and a mutual inductance $L_g$ 360.

Kirchhoff's laws for this circuit give us four equations:

$$I_{C_a} + I_{L_a} + I_g = 0$$

$$I_{C_b} + I_{L_b} - I_g = 0$$

$$L_a \dot{i}_{L_a} + L_g \dot{i}_{L_b} = V_a$$

$$L_b \dot{i}_{L_b} + L_g \dot{i}_{L_a} = V_b \qquad (1)$$

In order to get useful equations of motion, it is preferable to work with all voltages or all currents. For purposes of the present analysis, voltages have been selected. The capacitor currents can be related to voltage via the constitutive equation for a capacitor: $C_i \dot{V}_i = I_i$. Note that for the coupling capacitor 310, the constitutive relation gives $I_g = C_g(\dot{V}_a - \dot{V}_b)$. To relate the inductor currents to voltages, the bottom two equations from Kirchhoff's laws in (1) can be written in matrix form as $$\begin{pmatrix} V_a \\ V_b \end{pmatrix} = \underbrace{\begin{pmatrix} L_a & L_g \\ L_g & L_b \end{pmatrix}}_{T_L} \begin{pmatrix} i_a \\ i_b \end{pmatrix}$$

Inverting $T_L$ gives $$T_L^{-1} = \frac{1}{L_a L_b - L_g^2} \begin{pmatrix} L_b & -L_g \\ -L_g & L_a \end{pmatrix}$$

$$\equiv \begin{pmatrix} 1/L_{a\prime} & -1/L_{g\prime} \\ -1/L_{g\prime} & 1/L_{b\prime} \end{pmatrix}$$

Which in turn provides:

$$i_{L_a} = \frac{V_a}{L_{a\prime}} - \frac{V_b}{L_{g\prime}}$$

$$i_{L_b} = \frac{V_b}{L_{b\prime}} - \frac{V_a}{L_{g\prime}}$$

Additionally, the inductances to ground for each resonator, including the inductance through the mutual inductance 360 can be written as $$L_{a\prime} \equiv L_a - \frac{L_g^2}{L_b}$$

$$\text{and } L_{b\prime} \equiv L_b - \frac{L_g^2}{L_a}$$

Rewriting all of the currents in the first two of Kirchoff's laws in (1) entirely in terms of $V_a$ and $V_b$ provides:

$$C_a \ddot{V}_a + \frac{V_a}{L_{a\prime}} - \frac{V_b}{L_{g\prime}} + C_g(\ddot{V}_a - \ddot{V}_b) = 0$$

$$C_b \ddot{V}_b + \frac{V_b}{L_{b\prime}} - \frac{V_a}{L_{g\prime}} + C_g(\ddot{V}_b - \ddot{V}_a) = 0$$

In order to analyze this circuit using flux and charge instead of current and voltage, define $\Phi = \int V \, dt$, and the equations of motion can be rewritten as:

$$\ddot{\Phi}_a(C_a + C_g) - C_g \ddot{\Phi}_b + \frac{\Phi_a}{L_{a\prime}} - \frac{\Phi_b}{L_{g\prime}} = 0$$

$$\ddot{\Phi}_b(C_b + C_g) - C_g \ddot{\Phi}_a + \frac{\Phi_b}{L_{b\prime}} - \frac{\Phi_a}{L_{g\prime}} = 0$$

Moreover, these equations can further be noted to come from the Lagrangian:

$$\mathcal{L} = \underbrace{\frac{C_g}{2}(\dot{\Phi}_a - \dot{\Phi}_b)^2 + \frac{C_a}{2}\dot{\Phi}_a^2 + \frac{C_b}{2}\dot{\Phi}_b^2}_{kinetic} \underbrace{- \frac{\Phi_a^2}{2L_{a\prime}} - \frac{\Phi_b^2}{2L_{b\prime}} + \frac{\Phi_a \Phi_b}{L_{g\prime}}}_{potential} \qquad (2)$$

The momenta conjugate to $\Phi_a$ and $\Phi_b$ are:

$$Q_a \equiv \frac{\partial \mathcal{L}}{\partial \dot{\Phi}_a} = (C_a + C_g)\dot{\Phi}_a - C_g \dot{\Phi}_b$$

-continued $$Q_b \equiv \frac{\partial \mathcal{L}}{\partial \dot{\Phi}_b} = (C_b + C_g)\dot{\Phi}_b - C_g \dot{\Phi}_a$$

which can be rewritten as:

$$\begin{pmatrix} Q_a \\ Q_b \end{pmatrix} = \underbrace{\begin{pmatrix} (C_a + C_g) & -C_g \\ -C_g & (C_b + C_g) \end{pmatrix}}_{T_C} \begin{pmatrix} \dot{\Phi}_a \\ \dot{\Phi}_b \end{pmatrix}$$

The inverse of $T_C$ is:

$$T_C^{-1} = \frac{1}{C_a C_b + C_g(C_a + C_b)} \begin{pmatrix} (C_b + C_g) & C_g \\ C_g & (C_a + C_g) \end{pmatrix}$$

$$\equiv \begin{pmatrix} 1/C_{a\prime} & 1/C_{g\prime} \\ 1/C_{g\prime} & 1/C_{b\prime} \end{pmatrix}$$

Notably, $C_{a\prime}$ and $C_{b\prime}$ are the total capacitances to ground for each resonator circuit. The Hamiltonian function H for the system is defined formally by the equation:

$$H \equiv \left( \sum_{i=\{a,b\}} Q_i \dot{\Phi}_i \right) - \mathcal{L}$$

where $\Phi_i$ are the coordinates and $Q_i$ are the conjugate momenta. It is preferable to replace the $\dot{\Phi}$'s in both the $Q\dot{\Phi}$ terms and in $\mathcal{L}$ with $\Phi$'s and Q's. The kinetic term in the Lagrangian can be expressed as:

$$\mathcal{L}_{kinetic} = \frac{1}{2} \langle \dot{\Phi} | T_C | \dot{\Phi} \rangle$$

$$= \frac{1}{2} \langle T_C^{-1} Q | T_C | T_C^{-1} Q \rangle$$

$$= \frac{1}{2} \langle Q | T_C^{-1} | Q \rangle$$

Because $\sum_i \dot{\Phi}_i Q_i = \langle Q | T_C^{-1} | Q \rangle$, the Hamiltonian can be written as:

$$H = \left( \sum_{i \in \{a,b\}} Q_i \dot{\Phi}_i \right) - \mathcal{L} \quad (3)$$

$$= \langle Q | T_C^{-1} | Q \rangle - (\mathcal{L}_{kinetic} + \mathcal{L}_{potential})$$

$$= \langle Q | T_C^{-1} | Q \rangle - \left( \frac{1}{2} \langle Q | T_C^{-1} | Q \rangle + \mathcal{L}_{potential} \right)$$

$$= \frac{Q_a^2}{2C_{a\prime}} + \frac{Q_b^2}{2C_{b\prime}} + \frac{\Phi_a^2}{2L_{a\prime}} + \frac{\Phi_b^2}{2L_{b\prime}} + \underbrace{\frac{Q_a Q_b}{C_{g\prime}} - \frac{\Phi_a \Phi_b}{L_{g\prime}}}_{coupling\ Hamiltonian\ H_g}$$

In order to simplify the Hamiltonian to more easily find its normal modes, define:

$$X_i \equiv \frac{1}{\sqrt{2\hbar}} \frac{1}{\sqrt{Z_{i\prime}}} \Phi_i$$

$$Y_i \equiv \frac{1}{\sqrt{2\hbar}} \sqrt{Z_{i\prime}} \, Q_i$$

where $Z_i \equiv \sqrt{L_i/C_i}$, and the constant $\hbar$ with dimensions of action has been added to make X and Y dimensionless. In a classical analysis as presented herein, the classical case $\hbar$ can be considered as anything with dimensions of action. However, in the quantum case, $\Phi$, Q, X, and Y are operators and $\hbar$ is Planck's constant.

In the new coordinates, the Hamiltonian can be written as:

$$H/\hbar = \omega_{a\prime}(X_a^2 + Y_a^2) + \omega_{b\prime}(X_b^2 + Y_b^2) 2 \frac{1}{C_{g\prime} \sqrt{Z_{a\prime} Z_{b\prime}}} Y_a Y_b - 2 \frac{\sqrt{Z_a Z_b}}{L_{g\prime}} X_a X_b \quad (4)$$

where $$\omega_{i\prime} = \sqrt{\frac{1}{L_{i\prime} C_{i\prime}}}$$

are called partial frequencies and play an important role in the analysis of the system, particularly when making approximations.

Finally, define:

$$a \equiv X_a + i Y_a$$

$$b \equiv X_b + i Y_b \quad (5)$$

To obtain:

$$H/\hbar = \omega_{a\prime} a^* a + \omega_{b\prime} b^* b - \frac{1}{2} \frac{1}{C_{g\prime} \sqrt{Z_{a\prime} Z_{b\prime}}} (ab + a^* b^* - ab^* - a^* b) - \frac{1}{2} \frac{\sqrt{Z_{a\prime} Z_{b\prime}}}{L_{g\prime}} (ab + a^* b^* + a^* b + ab^*) \quad (6)$$

The stars indicate Hermitian conjugation, which in the classical case reduces to complex conjugation. The coupling term can be reorganized in a useful form:

$$H_g/\hbar = -(ab + a^* b^*) \frac{1}{2} \left( \frac{1}{C_{g\prime} \sqrt{Z_{a\prime} Z_{b\prime}}} + \frac{\sqrt{Z_{a\prime} Z_{b\prime}}}{L_{g\prime}} \right) + \quad (7)$$

$$(ab^* + a^* b) \frac{1}{2} \left( \frac{1}{C_{g\prime} \sqrt{Z_{a\prime} Z_{b\prime}}} - \frac{\sqrt{Z_{a\prime} Z_{b\prime}}}{L_{g\prime}} \right)$$

$$= -g_+(ab + a^* b^*) + g_-(ab^* + a^* b)$$

Using the previous definitions:

$$g_c \equiv \frac{1}{2} \frac{1}{C_{g'} \sqrt{Z_{a'} Z_{b'}}} \quad g_l \equiv \frac{1}{2} \frac{\sqrt{Z_{a'} Z_{b'}}}{L_{g'}} \quad (8)$$

and $g_+ \equiv g_c + g_l \quad g_- \equiv g_c - g_l$

Hamilton's equations of motion can now be expressed in matrix form as:

$$\frac{d}{dt}\begin{pmatrix} a \\ b \\ a^* \\ b^* \end{pmatrix} = -i \begin{pmatrix} \omega_{a'} & g_- & 0 & -g_+ \\ g_- & \omega_{b'} & -g_+ & 0 \\ 0 & g_+ & -\omega_{a'} & -g_- \\ g_+ & 0 & -g_- & -\omega_{b'} \end{pmatrix}\begin{pmatrix} a \\ b \\ a^* \\ b^* \end{pmatrix}$$

The matrix in these equations of motion can be expressed algebraically as $$-i\left[\sigma_z \otimes \left(g_- \sigma_x + \frac{\Delta}{2}\sigma_z + \frac{S}{2}\mathbb{1}\right) - ig_+(\sigma_y \otimes \sigma_x)\right] \quad (9)$$

where $S \equiv \omega_{a'} + \omega_{b'}$ and $\Delta \equiv \omega_{a'} - \omega_{b'}$. The rotating wave approximation drops the ab and a*b* terms of the coupling Hamiltonian, e.g., the terms proportional to $g_+$. This is equivalent to dropping the antidiagonal part of the matrix representation of Hamilton's equations of motion and therefore the $\sigma_y \otimes \sigma_x$ term in the algebraic representation. In the matrix, it can further be noted that dropping these terms is precisely equivalent to decoupling the clockwise and counterclockwise rotating modes. In the rotating wave approximation, the algebraic representation can be reduced to:

$$-i\sigma_z \otimes \left(g_- \sigma_x + \frac{\Delta}{2}\sigma_z + \frac{S}{2}\mathbb{1}\right)$$

which makes finding the eigenvalues particularly simple because the eigenvalues of a tensor product are just the products of the eigenvalues of the individual tensors being multiplied. The eigenvalues of $\sigma_z$ are $\pm 1$. The eigenvalues of the elements in the parentheses, and therefore the normal mode frequencies, are therefore:

$$\omega_\pm = \frac{\omega_{a'} + \omega_{b'}}{2} \pm \sqrt{g_-^2 + (\Delta/2)^2} \quad (10)$$

Figure 4:
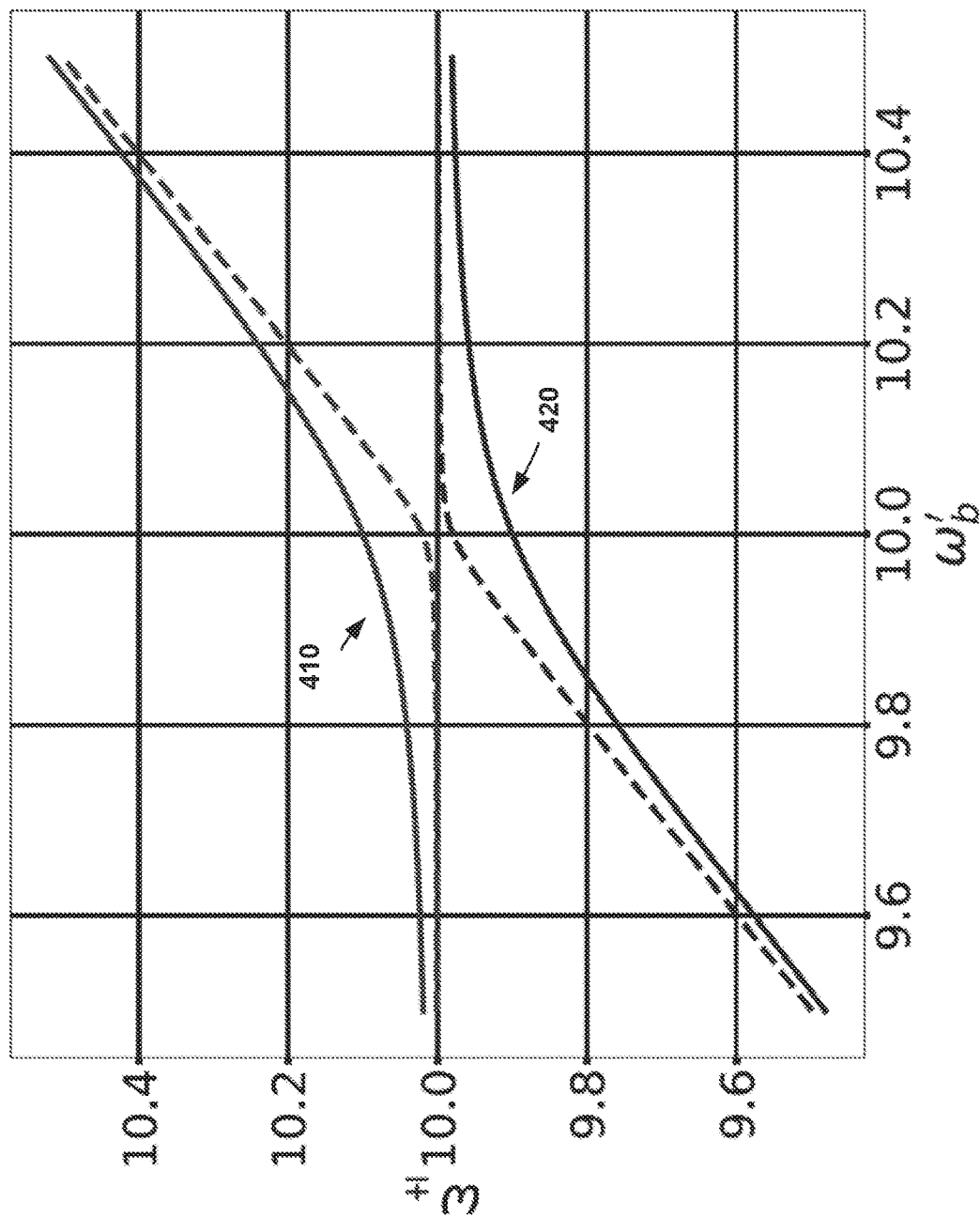
FIG. 4 depicts an example plot of eigenvalues for two coupled oscillators according to example aspects of the present disclosure.

These eigenvalues are shown in FIG. 4 as a function of both $g_-$ and $\omega_b$, which depict the avoided level crossing of coupled resonators in which normal frequencies $\omega_+$ (410) and $\omega_-$ (420) as a function of $\omega_b$, for $\omega_a = 10$ are shown. Dashed lines are for $g^- = 0.02$ and solid lines are for $g^- = 0.1$.

The rotating wave approximation (RWA) works in the limit $g_+ \ll \omega_{a'}, \omega_{b'}$. The present analysis demonstrates the usefulness of the Hamiltonian formalism: by working with the Hamiltonian, with its partial frequencies and impedances, the systematic and accurate approximation, namely the RWA, can be found for the normal mode frequencies. The symmetry in FIG. 4 exists because the normal frequencies are plotted against the partial frequency $\omega_{b'}$ rather than the uncoupled frequency $\omega_b$.

As shown above, the RWA is equivalent to dropping the Hamiltonian terms proportional to $g_+$. Therefore, in a device where $g_+$ is constructed to be exactly zero the RWA would be exact.

Thus, the coupling Hamiltonian between two resonators "a" and "b" with both capacitive and inductive coupling can be written as:

$$\frac{H_g}{\hbar} = -\frac{1}{2}(ab + a^* b^*)\left(\frac{1}{C_g' \sqrt{Z_a' Z_b'}} + \frac{\sqrt{Z_a' Z_b'}}{L_g'}\right) +$$

$$\frac{1}{2}(a^* b + ab^*)\left(\frac{1}{C_g' \sqrt{Z_a' Z_b'}} - \frac{\sqrt{Z_a' Z_b'}}{L_g'}\right)$$

where $C_g'$ is the coupling capacitance, $L_g'$ is the coupling inductance, $Z_a'$ and $Z_b'$ are the characteristic impedances of the resonators, and the (ab+a*b*) term is responsible for the non-RWA processes. The variables a and b can be considered as the quantum-mechanical lowering operators for resonators "a" and "b", while the variables a* and b* can be considered the associated raising operators. Thus, in the condition that $L_g'/C_g' = -Z_a' Z_b'$, the coefficient of the non-RWA portion of the coupling vanishes.

Thus, referring back to FIG. 2, according to example aspects of the present disclosure, the inductive coupling provided by the inductor 270 can be selected to approximately satisfy the condition such that $L_g'/C_g' = -Z_a' Z_b'$. By doing so, the non-RWA processes can be reduced and, in some cases, removed as compared to a quantum circuit without the inductive coupling between the readout resonator 250 and the inductor of the qubit (e.g., the SQUID 215). In turn, this can allow for the power of a measurement pulse to be increased, thereby reducing the SNR. Further, the coupling strength of the inductive coupling and the coupling strength of the capacitive coupling can be approximately equal such that a measurement pulse does not induce a significant change in the qubit structure state. For example, the incidence rate of a state change induced by the measurement pulse can be less than 0.5%.

Figure 5:
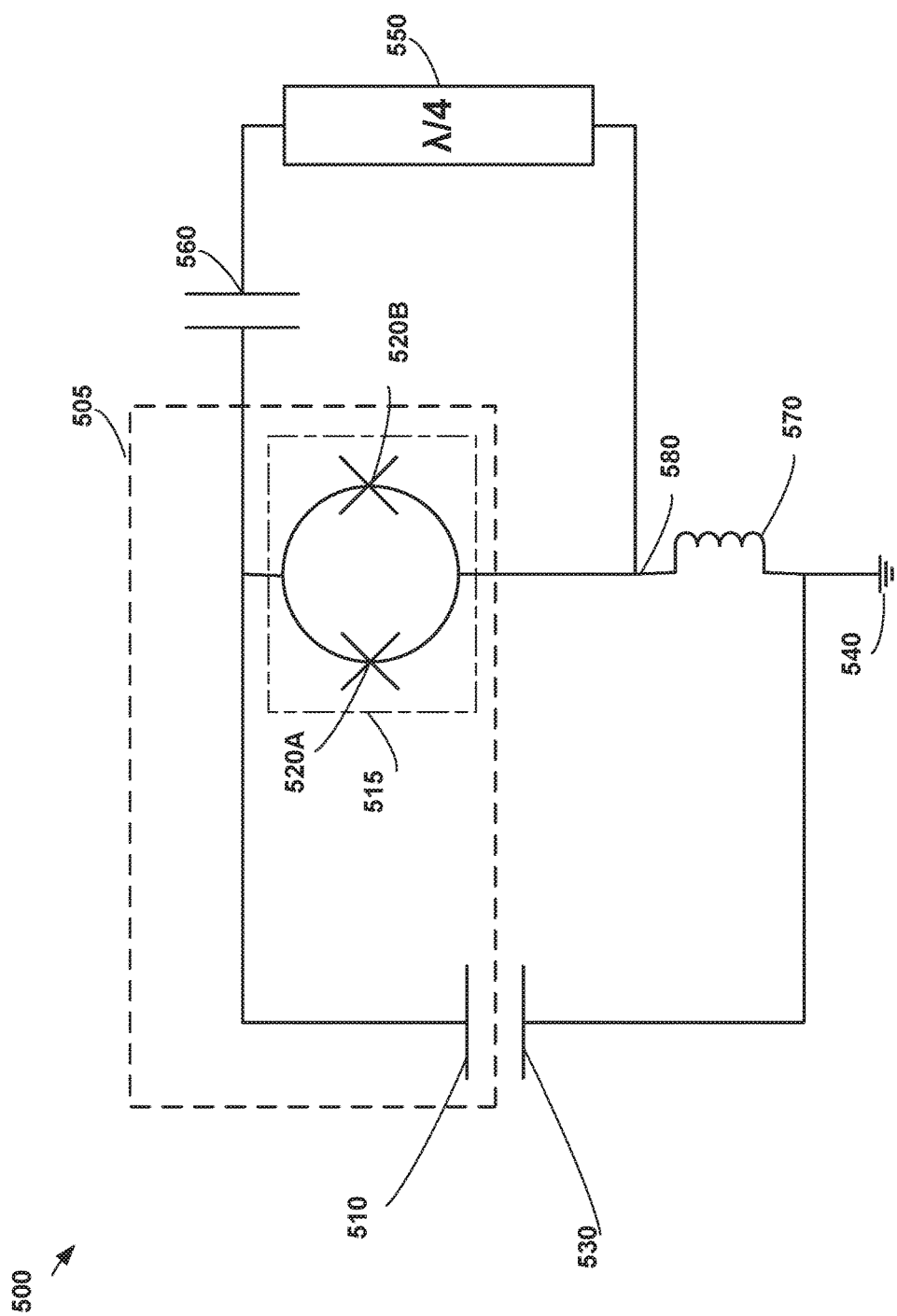
FIG. 5 depicts a circuit diagram of an example quantum circuit with a transmon qubit according to example aspects of the present disclosure.

Referring now to FIG. 5, a circuit diagram of an example quantum circuit 500 with a transmon qubit according to example aspects of the present disclosure is depicted. The example quantum circuit 500 corresponds to the quantum circuit 200 depicted in FIG. 2.

As shown, the quantum circuit 500 can include a qubit structure 505, which can include at least a first portion of a qubit capacitor 510 and an inductor. For example, as shown, the qubit structure 505 is a transmon qubit. As depicted, the inductor can be a SQUID 515, which can include two Josephson junctions 520A and 520B. In other implementations, the qubit structure 505 can include one or more Josephson junctions or other types of inductors. A second portion of the qubit capacitor 530 can be connected to a ground 540. The first portion 510 and the second portion 530 can comprise a qubit capacitance.

The qubit structure 505 is an anharmonic resonator, and can be coupled to a readout resonator 550, which is an auxiliary harmonic resonator. For example, as shown in FIG. 5, the qubit structure can be capacitively coupled to the readout resonator 550 via capacitor 560. In some implementations, the readout resonator can be a quarter wave readout resonator configured to measure the state of the qubit structure using dispersive measurement.

As shown, the readout resonator 550 can further be inductively coupled to the qubit structure 505. For example, an inductor 570 can be coupled to a node 580 and the ground 540. In some implementations, the inductor 570 can be, for example, a thin wire (e.g., a thin superconducting wire), a coil of wire, a Josephson junction, or other suitable inductor. The node 580 can further be coupled to the SQUID 515. The readout resonator 550 can be coupled to the node 580. The strength of the inductive coupling can be selected to balance the strength of the capacitive coupling, as described herein.

Figure 6:
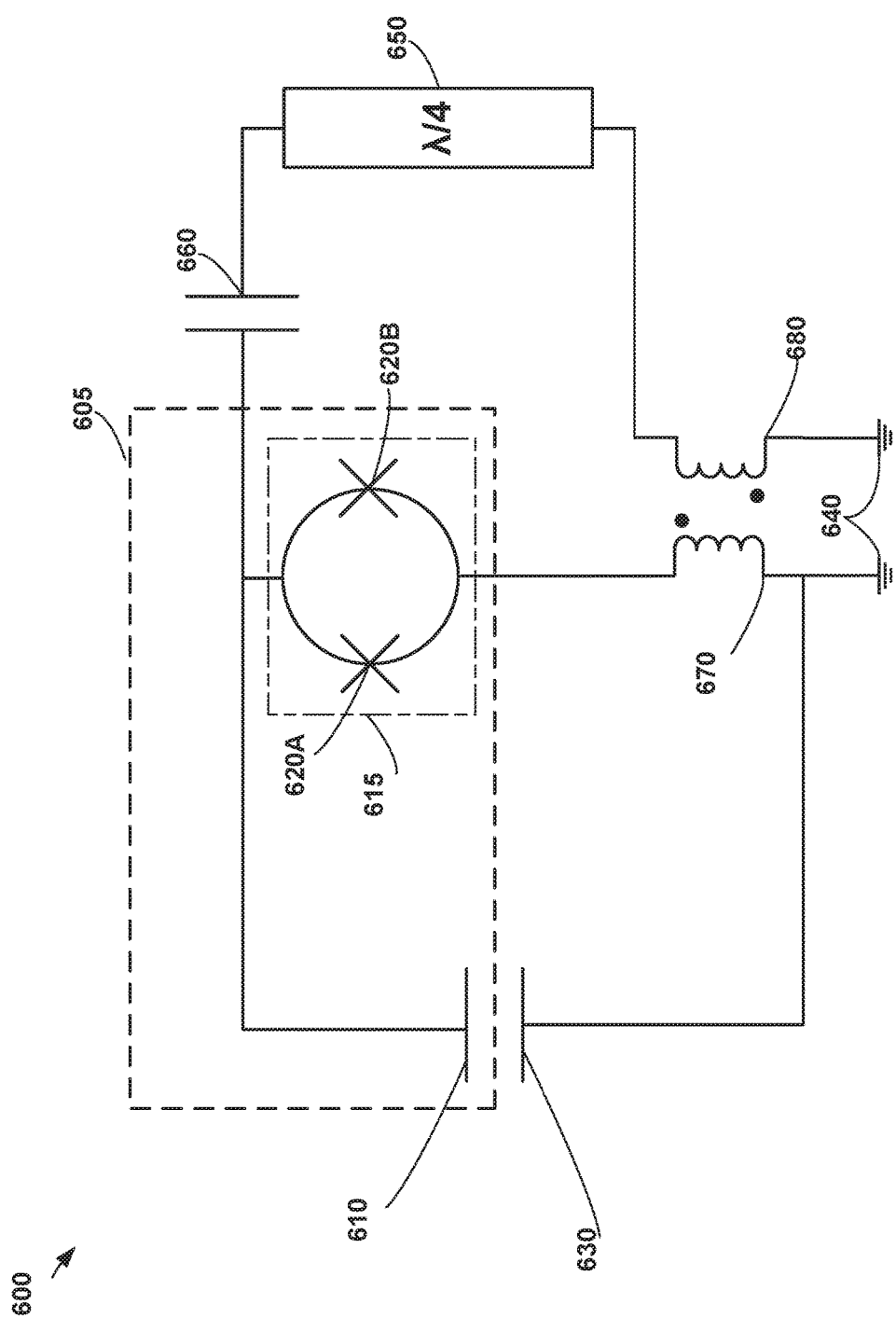
FIG. 6 depicts a circuit diagram of an example quantum circuit with a transmon qubit according to example aspects of the present disclosure.

Referring now to FIG. 6, a circuit diagram of an example quantum circuit 600 with a transmon qubit according to example aspects of the present disclosure is depicted. As shown, the quantum circuit 600 can include a qubit structure 605, which can include at least a first portion of a qubit capacitor 610 and an inductor. For example, as shown, the qubit structure 605 is a transmon qubit, and the inductor is a SQUID 615, which can include two Josephson junctions 620A and 620B. In other implementations, the qubit structure 605 can include one or more Josephson junctions or other types of inductors. A second portion of the qubit capacitor 630 can be connected to a ground 640. The first portion 610 and the second portion 630 can comprise a qubit capacitance.

The qubit structure 605 is an anharmonic resonator, and can be coupled to a readout resonator 650, which is an auxiliary harmonic resonator. For example, as shown in FIG. 6, the qubit structure can be capacitively coupled to the readout resonator 650 via capacitor 660. In some implementations, the readout resonator can be a quarter wave readout resonator configured to measure the state of the qubit structure using dispersive measurement.

As shown, the readout resonator 650 can further be inductively coupled to the qubit structure 605. For example, a first inductor 670 can be coupled between the SQUID 620 and the ground 640. A second inductor 680 can be coupled between the readout resonator 650 and the ground 640. The first inductor 670 and the second inductor 680 can together provide a mutual inductance. The two dots on opposite sides of the inductors 670 and 680 indicate that the mutual inductance between inductors 670 and 680 is negative. In some implementations, the inductors 670 and 680 can be, for example, thin wires (e.g., thin superconducting wires), coils of wire, Josephson junctions, or other suitable inductors. The strength of the inductive coupling can be selected to balance the strength of the capacitive coupling, as described herein.

Figure 7:
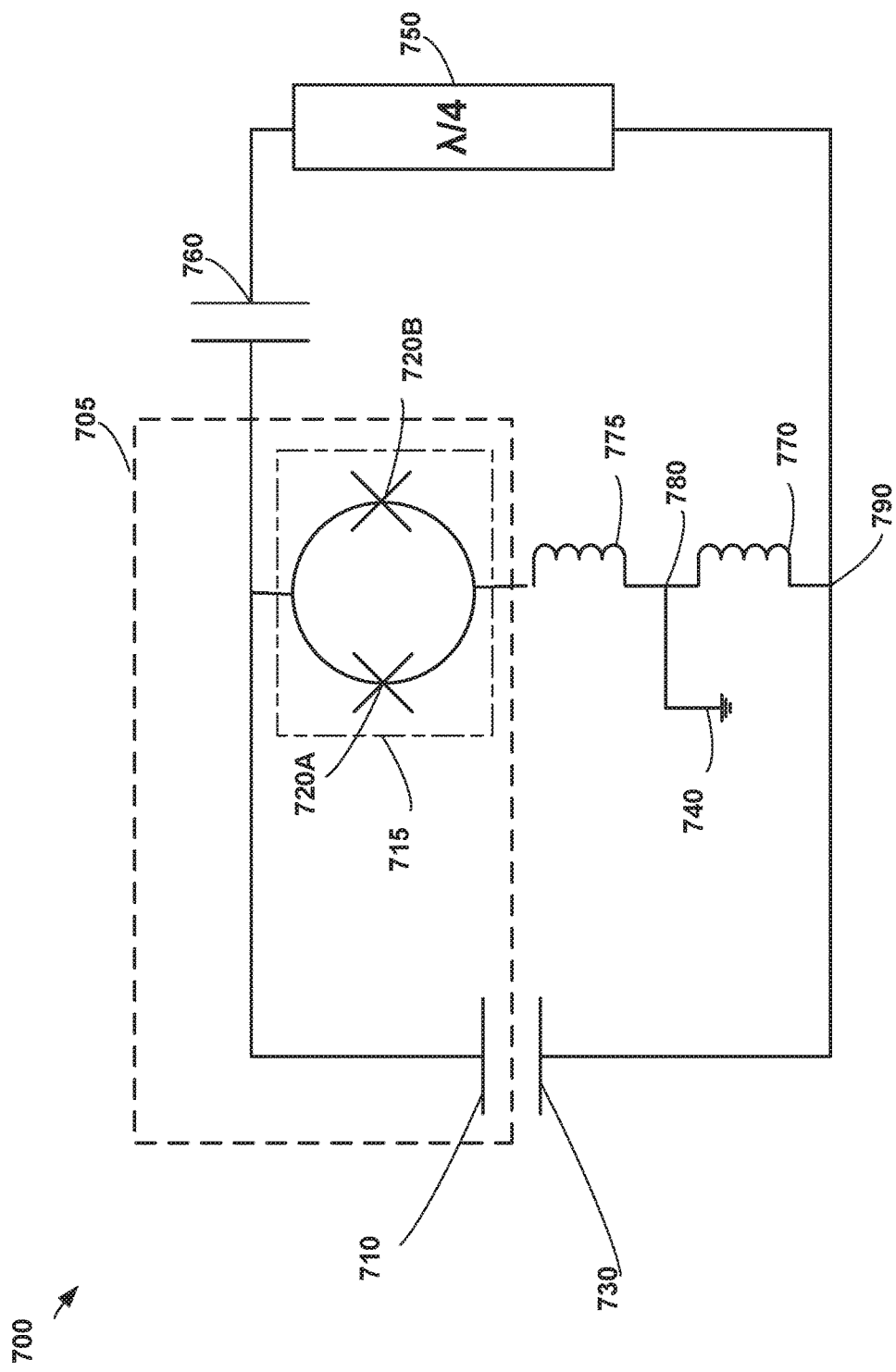
FIG. 7 depicts a circuit diagram of an example quantum circuit with a transmon qubit according to example aspects of the present disclosure.

Referring now to FIG. 7, a circuit diagram of an example quantum circuit 700 with a transmon qubit according to example aspects of the present disclosure is depicted. As shown, the quantum circuit 700 can include a qubit structure 705, which can include at least a first portion of a qubit capacitor 710 and an inductor. For example, as shown, the qubit structure 705 is a transmon qubit. As depicted, the inductor can be a SQUID 715, which can include two Josephson junctions 720A and 720B. In other implementations, the qubit structure 705 can include one or more Josephson junctions or other types of inductors. A second portion of the qubit capacitor 730 can be connected to node 790. The first portion 710 and the second portion 730 can comprise a qubit capacitance.

The qubit structure 705 is an anharmonic resonator, and can be coupled to a readout resonator 750, which is an auxiliary harmonic resonator. For example, as shown in FIG. 7, the qubit structure can be capacitively coupled to the readout resonator 750 via capacitor 760. In some implementations, the readout resonator can be a quarter wave readout resonator configured to measure the state of the qubit structure using dispersive measurement.

As shown, the readout resonator 750 can further be inductively coupled to the qubit structure 705. For example, an inductor 775 can be coupled between a node 780 and the SQUID 715. An additional inductor 780 can be coupled between the node 780 and the node 790. The node 780 can be coupled to a ground 740. In some implementations, the inductors 775 and 770 can be, for example, thin wires (e.g., thin superconducting wires), coils of wire, Josephson junctions, or other suitable inductors. The strength of the inductive coupling can be selected to balance the strength of the capacitive coupling, as described herein.

Figure 8:
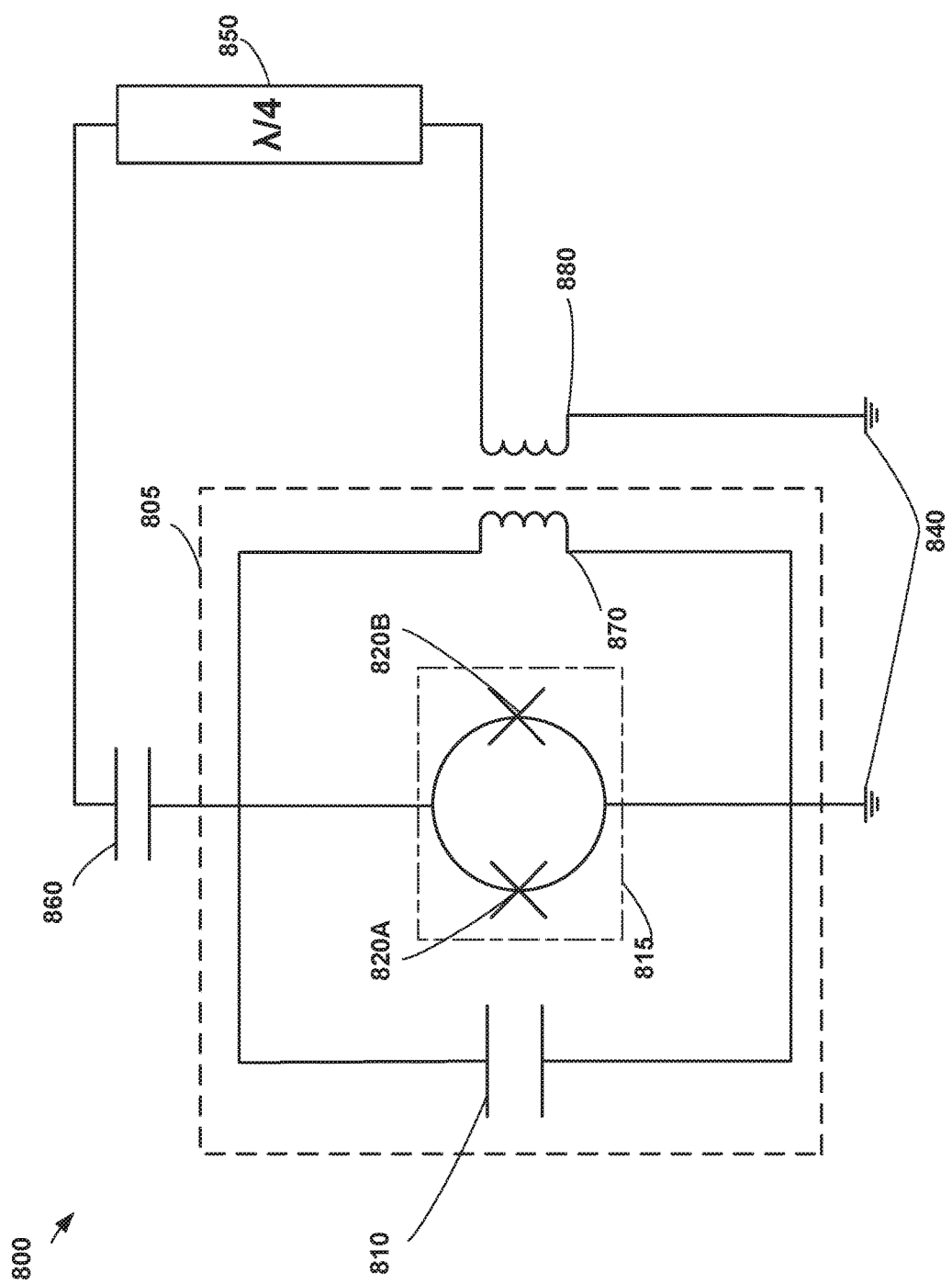
FIG. 8 depicts a circuit diagram of an example quantum circuit with a flux qubit according to example aspects of the present disclosure.

Referring now to FIG. 8, a circuit diagram of an example quantum circuit 800 with a flux qubit according to example aspects of the present disclosure is depicted. As shown, the quantum circuit 800 can include a qubit structure 805, which can include at least a capacitor 810, a SQUID 815, and an inductor 870. For example, as shown, the SQUID 815 can include two Josephson junctions 820A and 820B. The capacitor 810, the SQUID 815, and the inductor 870 can be coupled in parallel. The qubit structure 805 can be coupled to a ground 840 as shown.

The qubit structure 805 is an anharmonic resonator, and can be coupled to a readout resonator 850, which is an auxiliary harmonic resonator. For example, as shown in FIG. 8, the qubit structure 805 can be capacitively coupled to the readout resonator 850 via capacitor 860. In some implementations, the readout resonator can be a quarter wave readout resonator configured to measure the state of the qubit structure using dispersive measurement.

As shown, the readout resonator 850 can further be inductively coupled to the qubit structure 805. For example, the readout resonator 850 can be coupled to an inductor 870, which can be coupled to the ground 840. The inductor 870 of the qubit structure 805 and the inductor 880 coupled to the readout resonator 850 can together provide a mutual inductance. In some implementations, the inductors 870 and 880 can be, for example, thin wires (e.g., thin superconducting wires), coils of wire, Josephson junctions, or other suitable inductors. The strength of the inductive coupling can be selected to balance the strength of the capacitive coupling, as described herein.

Figure 9:
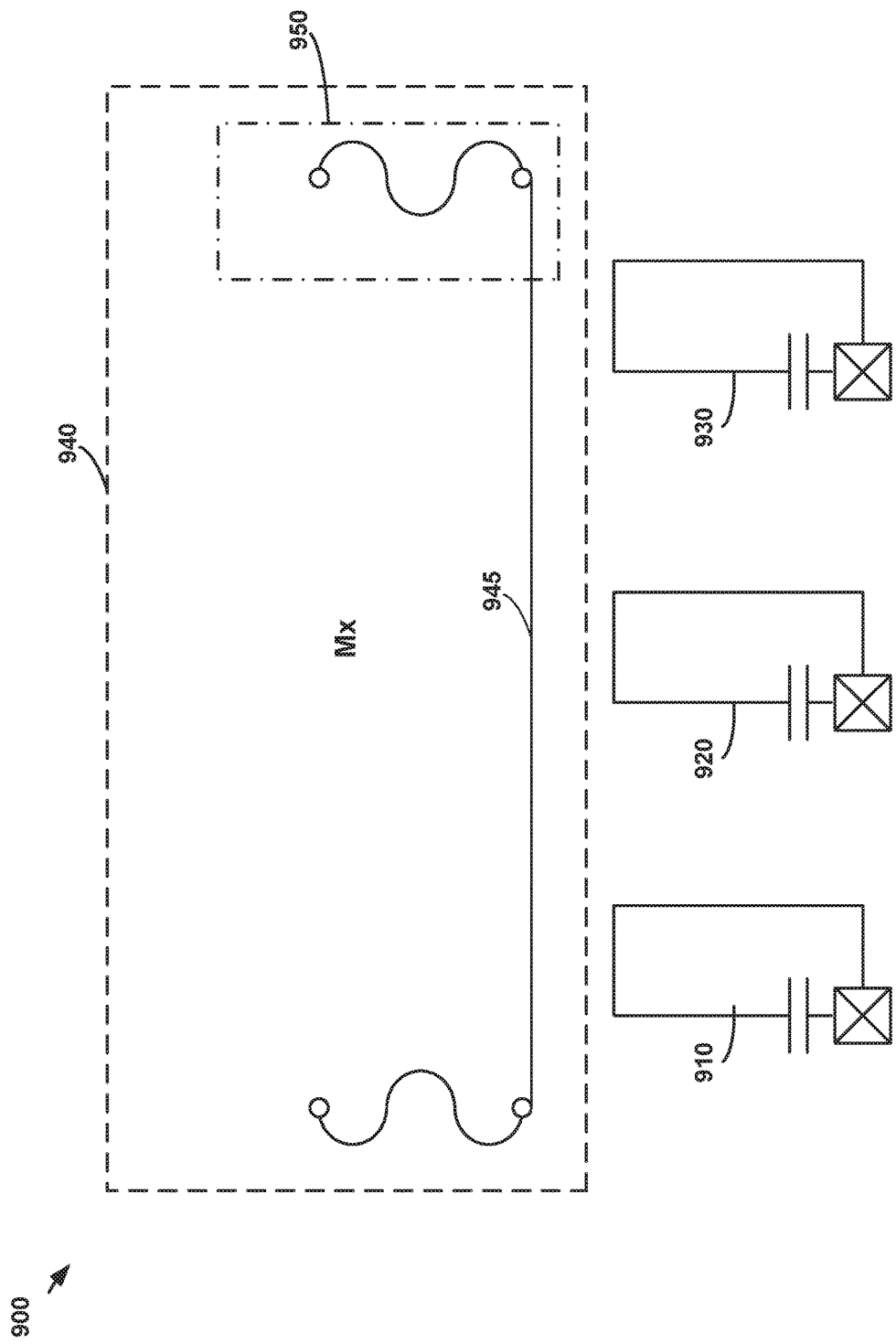
FIG. 9 depicts a circuit diagram of a multiplexed readout resonator with a plurality of quantum circuits according to example aspects of the present disclosure.

Referring now to FIG. 9, an example circuit diagram 900 of a multiplexed readout resonator with a plurality of quantum circuits according to example aspects of the present disclosure is depicted. As shown, a plurality of quantum circuits 910, 920, and 930 can each be capacitively and inductively coupled with a multiplexed readout resonator 940, as described herein. For example, the multiplexed readout resonator 940 can include a transmission line 945 and each of the quantum circuits can be capacitively and inductively coupled to the transmission line 945.

Additionally, in some implementations, the multiplexed readout resonator 940 can include or otherwise be coupled to a Purcell filter 950. For example, the Purcell filter can be configured to impede microwave propagation at the qubit frequency.

Figure 10:
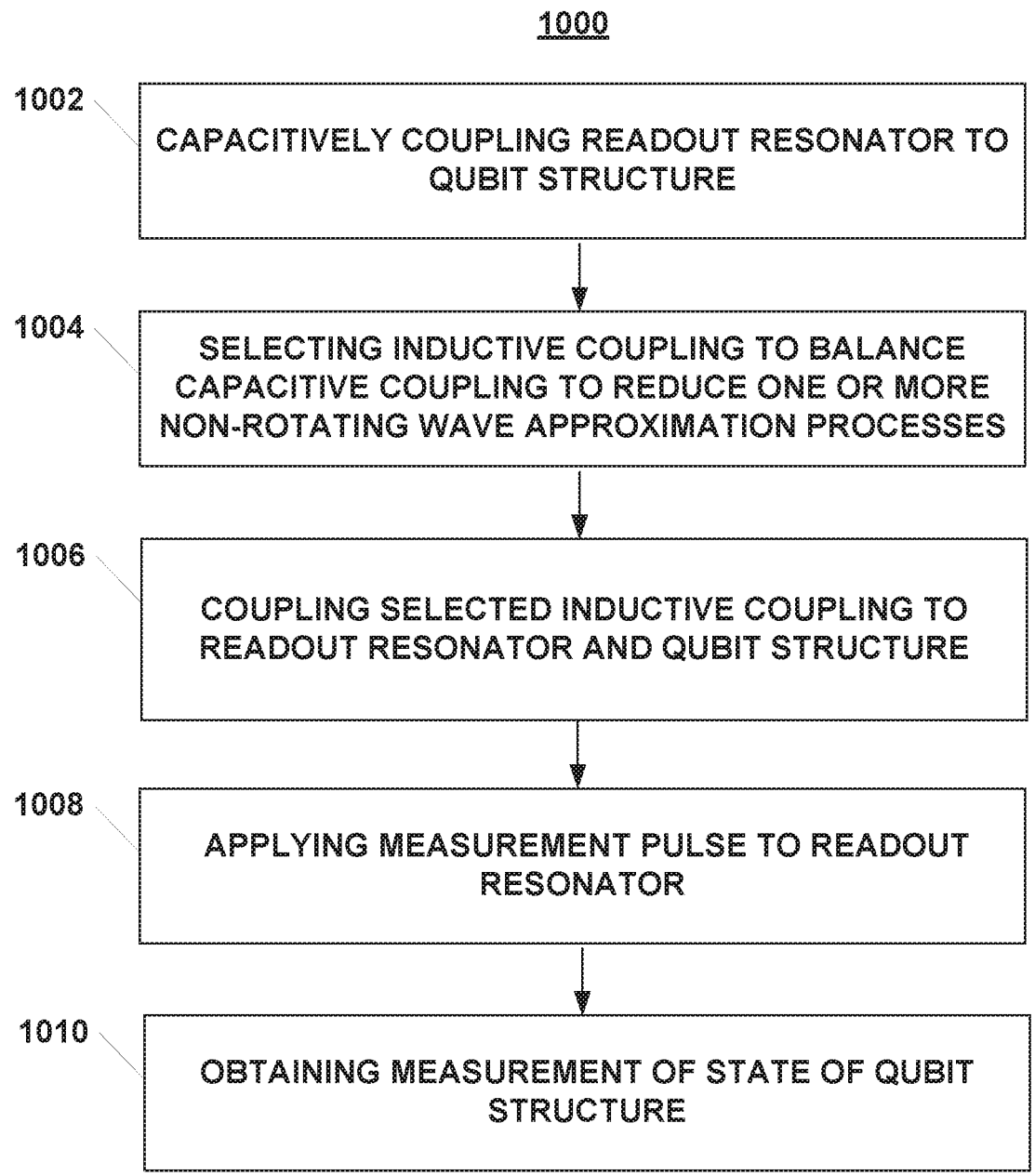
FIG. 10 depicts an example method according to example aspects of the present disclosure.

Referring now to FIG. 10, a flowchart of an example method 1000 according to example aspects of the present disclosure is depicted. The method 1000 can be used, for example, to measure a state of a qubit structure. The qubit structure can include at least a portion of a qubit capacitor and an inductor. The inductor can be, for example, one or more Josephson junctions, such as a SQUID. A second portion of the qubit capacitor can be coupled to a ground.

At 1002, the method 1000 can include capacitively coupling a readout resonator to the qubit structure. For example, a dispersive measurement readout resonator can be coupled to the qubit structure via a gap comprising a nonconductive material.

At 1004, the method 1000 can include selecting an inductive coupling to balance the capacitive coupling to reduce or remove one or more non-rotating wave approximation processes. For example, the inductive coupling can be selected to satisfy the condition that $L_g'/C_g'=Z_a'Z_b'$, where $C_g'$ is the coupling capacitance, $L_g'$ is the coupling inductance, $Z_a'$ and $Z_b'$ are the characteristic impedances of the qubit structure and the readout resonator, respectively.

At 1006, the method 1000 can include coupling the readout resonator to the qubit structure according to the selected inductive coupling. For example, in some implementations, the readout resonator can be coupled to a node positioned between the SQUID of the qubit structure and an inductor coupled between the node and the ground. In some implementations, a first inductor can be coupled between the SQUID and the ground, and a second inductor can be coupled between the readout resonator and the ground, such that the first inductor and the second inductor have a mutual inductance.

At 1008, the method 1000 can include providing a powered pulse to the readout resonator. For example, in some implementations, the powered pulse can be a microwave pulse. In some implementations, one or more parameters can be provided to a control device, which can cause the readout resonator to provide the powered pulse.

At 1010, the method 1000 can include obtaining a measurement of the state of the qubit structure. For example, the readout resonator can be configured so that the measurement of the qubit is obtained after a pulse is applied to the resonator. In some implementations, the measurement result can be provided to a classical processor.

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A quantum circuit, comprising:
   a qubit structure comprising an inductor and at least a first portion of a qubit capacitor;
   a ground;
   a second portion of the qubit capacitor coupled to the ground;
   a readout resonator configured to measure a state of the qubit structure;
   a capacitive coupling between the readout resonator and the qubit structure; and an inductive coupling between the readout resonator and the inductor of the qubit structure;
wherein a coupling strength of the inductive coupling and a coupling strength of the capacitive coupling are approximately equal in magnitude and opposite in sign such that providing a measurement pulse to the qubit structure induces a state change rate, in the qubit structure, that is less than 0.5%.

2. The quantum circuit of claim 1, wherein the inductor of the qubit structure comprises a first inductor; and
wherein the inductive coupling comprises:
a second inductor coupled between the first inductor and the ground; and
the readout resonator coupled to a node between the first inductor and the second inductor.

3. The quantum circuit of claim 1, wherein the inductor of the qubit structure comprises a first inductor;
wherein the inductive coupling comprises:
a second inductor coupled between the first inductor of the qubit structure and the ground; and
a third inductor coupled between the readout resonator and the ground;
wherein the inductive coupling comprises a mutual inductance between the second inductor and the third inductor; and
wherein the phase and voltage of the current in the second inductor and the third inductor are opposite.

4. The quantum circuit of claim 1, wherein the inductor of the qubit structure comprises a first inductor; and
wherein the inductive coupling comprises:
a second inductor coupled between the first inductor of the qubit structure and a first node; and
a third inductor coupled between the first node and a second node;
wherein the readout resonator is coupled to the second node; and
wherein the second portion of the qubit capacitor is coupled to the ground via the third inductor by coupling the second portion of the qubit capacitor to the second node.

5. The quantum circuit of claim 1, wherein the inductor of the qubit structure comprises a first inductor;
wherein the first inductor comprises a superconducting quantum interference device;
wherein the qubit structure further comprises a second inductor;
wherein the inductive coupling comprises a third inductor coupled between the readout resonator and the ground; and
wherein the inductive coupling comprises a mutual inductance between the second inductor and the third inductor.

6. The quantum circuit of claim 1, wherein the qubit structure comprises a transmon qubit, a charge qubit, or a flux qubit.

7. The quantum circuit of claim 1, wherein the inductor of the qubit structure comprises one or more Josephson junctions.

8. The quantum circuit of claim 7, wherein the one or more Josephson junctions comprise a superconducting quantum interference device.

9. The quantum circuit of claim 1, wherein the readout resonator comprises a dispersive readout resonator coupled to a Purcell filter.

10. The quantum circuit of claim 1, wherein a Hamiltonian expression describes the quantum circuit and the coupling strength of the inductive coupling and the coupling strength of the capacitive coupling are approximately equal and opposite in sign such that a term in the Hamiltonian expression that corresponds to one or more non-rotating wave approximation (RWA) processes is reduced or eliminated as compared to another Hamiltonian expression describing another quantum circuit without the inductive coupling between the readout resonator and the inductor of the qubit structure.

11. The quantum circuit of claim 10, wherein due to the coupling strength of the inductive coupling and the coupling strength of the capacitive coupling being approximately equal and opposite in sign, and in turn, reducing or eliminating the term in the Hamiltonian expression that corresponds to the non-RWA processes, when providing the measurement pulse to the qubit structure a change in the qubit structure state is reduced as compared to the other quantum circuit without the inductive coupling between the readout resonator and the inductor of the qubit structure.

12. A quantum computing system, comprising:
one or more quantum circuits, at least a first quantum circuit of the one or more quantum circuits comprising:
a readout resonator; and
a qubit structure;
wherein the qubit structure is both capacitively coupled to the readout resonator and inductively coupled to the readout resonator; and
wherein a capacitive coupling strength between the qubit structure and the readout resonator is approximately equal in magnitude and opposite in sign with an inductive coupling strength between the qubit structure and the readout resonator such that providing a measurement pulse to the qubit structure induces a state change rate, in the qubit structure, that is less than 0.5%.

13. The quantum computing system of claim 12, wherein, for at least the first quantum circuit, the qubit structure comprises:
a superconducting island that is capacitively coupled to the readout resonator; and
an inductor comprising one or more Josephson junctions.

14. The quantum computing system of claim 13, wherein, for at least the first quantum circuit, the inductor comprises a superconducting quantum interference device.

15. The quantum computing system of claim 13, wherein, for at least the first quantum circuit:
a first end of the inductor is electrically connected to a first end of the superconducting island of the qubit structure and a second end of the inductor is electrically connected to a first inductive element; and
a first end of the readout resonator is capacitively coupled to a second end of the superconducting island and a second end of the readout resonator is electrically connected to a second inductive element;
wherein the first inductive element and the second inductive element exhibit mutual inductance.

16. The quantum computing system of claim 13, wherein, for at least the first quantum circuit:
a first end of the inductor is electrically connected to a first end of the superconducting island of the qubit structure and a second end of the inductor is electrically connected to a first end of an inductive element;
a second end of the inductive element is electrically connected to an electrical ground; and
a first end of the readout resonator is capacitively coupled to a second end of the superconducting island and a second end of the readout resonator is electrically connected to the second end of the inductor and the first end of the inductive element.

17. The quantum computing system of claim 13, wherein, for at least the first quantum circuit:
- a first end of the inductor is electrically connected to a first end of the superconducting island of the qubit structure and a second end of the inductor is electrically connected to a first end of a first inductive element;
- a second end of the first inductive element is electrically connected to an electrical ground;
- a first end of the readout resonator is capacitively coupled to a second end of the superconducting island and a second end of the readout resonator is electrically connected to a first end of a second inductive element; and
- a second end of the second inductive element is electrically connected to the electrical ground.

18. The quantum computing system of claim 12, wherein:
- the one or more quantum circuits comprise a plurality of quantum circuits;
- the quantum computing system further comprises a Purcell filter; and
- at least the first quantum circuit and at least one other quantum circuit of the plurality of quantum circuits are coupled to the Purcell filter.

19. The quantum computing system of claim 12, wherein at least the first quantum circuit is configured on a single plane contained in a computer chip.

* * * * *